(12) United States Patent
Palaniappa (10) Patent No.: US 6,981,882 B1
(45) Date of Patent: Jan. 3, 2006

(54) PACKAGED DEVICE ADAPTER WITH TORQUE LIMITING ASSEMBLY

(75) Inventor: Ilavarasan Palaniappa, Apple Valley, MN (US)

(73) Assignee: Ironwood Electronics, Inc., Eagan, MN (US)

( * ) Notice: Subject to any disclaimer, the term of this patent is extended or adjusted under 35 U.S.C. 154(b) by 0 days.

(21) Appl. No.: 11/092,526

(22) Filed: Mar. 29, 2005

(51) Int. Cl.
*H01R 12/00* (2006.01)

(52) U.S. Cl. .................................................. 439/73

(58) Field of Classification Search ............... 439/68, 439/71, 73, 331
See application file for complete search history.

(56) References Cited

U.S. PATENT DOCUMENTS

| | | | |
|---|---|---|---|
| 4,460,223 A | | 7/1984 | Brown |
| 4,472,097 A | | 9/1984 | Kiefer |
| 4,472,098 A | | 9/1984 | Kiefer |
| 4,512,697 A | | 4/1985 | Cascini |
| 4,687,392 A | | 8/1987 | Bidwell |
| 5,468,158 A | * | 11/1995 | Roebuck et al. ............ 439/264 |
| 5,681,135 A | | 10/1997 | Simonson |
| 5,730,620 A | | 3/1998 | Chan et al. |
| 5,741,141 A | * | 4/1998 | O'Malley .................... 439/73 |
| 5,779,409 A | | 7/1998 | Manzolli |
| 5,784,738 A | | 7/1998 | Updike |
| 5,791,914 A | | 8/1998 | Loranger et al. |
| 5,793,618 A | * | 8/1998 | Chan et al. ................. 361/809 |
| 5,882,221 A | * | 3/1999 | Nguyen et al. ............. 439/331 |
| 5,892,245 A | | 4/1999 | Hilton |
| 5,975,915 A | * | 11/1999 | Yamazaki et al. ............ 439/72 |
| 5,989,039 A | * | 11/1999 | Sik .............................. 439/73 |
| 5,997,316 A | * | 12/1999 | Kunzel ........................ 439/73 |
| 6,022,225 A | * | 2/2000 | Chapin et al. ................ 439/73 |
| 6,082,941 A | | 7/2000 | Dupont et al. |
| 6,123,552 A | * | 9/2000 | Sakata et al. ................. 439/71 |
| 6,152,744 A | * | 11/2000 | Maeda ......................... 439/71 |
| 6,325,638 B1 | * | 12/2001 | Chapin et al. ................ 439/73 |
| 6,394,820 B1 | | 5/2002 | Palaniappa et al. |
| 6,439,897 B1 | * | 8/2002 | Ikeya ........................... 439/73 |
| 6,497,582 B1 | * | 12/2002 | Hoffmeyer ................... 439/71 |
| 6,533,589 B1 | | 3/2003 | Palaniappa et al. |
| 6,802,680 B1 | | 10/2004 | Rubenstein |
| 6,805,563 B2 | * | 10/2004 | Ohashi ......................... 439/73 |
| 6,910,898 B2 | * | 6/2005 | Suzuki et al. ................. 439/73 |
| 2003/0082934 A1 | * | 5/2003 | Mae ............................. 439/73 |
| 2004/0242030 A1 | * | 12/2004 | Palaniappa et al. ........... 439/73 |
| 2005/0020116 A1 | * | 1/2005 | Kawazoe et al. ........... 439/331 |

* cited by examiner

*Primary Examiner*—Ross Gushi
(74) *Attorney, Agent, or Firm*—Mueting, Raasch & Gebhardt, P.A.

(57) ABSTRACT

An adapter apparatus and method includes using an adapter body that includes a threaded opening. A torque limiting assembly is used in applying a force upon a packaged device received in a cavity of the adapter body. The torque limiting assembly includes a shaft, a threaded interface member including a threaded portion configured to mate with the threaded opening of the adapter body, one or more engagement elements, and a torque control apparatus used to selectively engage the threaded interface member and the shaft in a first state and allow movement between the threaded interface member and the shaft in a second state.

20 Claims, 8 Drawing Sheets

PACKAGED DEVICE ADAPTER WITH TORQUE LIMITING ASSEMBLY

BACKGROUND OF THE INVENTION

The present invention relates to electrical adapters and methods using such adapters. More particularly, the present invention pertains to employing a torque limiting apparatus with adapters for packaged integrated circuit devices (e.g., micro lead frame packages, micro lead chip carriers, quad flat no lead packages, and micro ball grid array packages, etc.) and methods for using such adapters.

Certain types of integrated circuit packages are becoming increasingly popular due to their occupancy area efficiency. In other words, they occupy less area on a target board on which they are mounted while providing a high density of contact terminals. For example, one such high density package type is a micro lead frame package. Generally, such packages contain an integrated circuit having its die bond pads electrically connected to respective conductive contact lead elements (e.g., lands) that are distributed on a surface of the package (e.g., the bottom surface of the package, for example, in an array).

A target printed circuit board upon which the package is to be mounted typically has formed on its surface a corresponding array of conductive pads which are aligned with the conductive contact lead elements of the package for electrically mounting the package on the target board. The target board typically includes other conductive traces and elements which lead from the array of conductive pads used for mounting the package to other circuitry on the board for connecting various components mounted thereon.

Typically, to mount such a package to a target board, solder material (e.g., solder balls) is provided in a manner corresponding to the array of conductive pads on the target board. The package is positioned with the contact lead elements in contact with the solder material corresponding to the array of conductive pads on the target board. The resulting structure is then heated until the solder material is melted and fused to the contact lead elements of the package.

Such area efficient packaging, e.g., micro lead frame packages or micro ball grid array packages, provide a high density of terminals at a very low cost. Also, this packaging provides for limited lead lengths. The limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a package mounted thereon, the designer must first electrically connect the package to the target circuit board (e.g., using solder balls).

As described above, this may include mounting the package on the target board and heating the solder material (e.g., solder spheres) to fuse the solder material to the contact lead elements of the package. Therefore, the package may be prevented from being used again. It is desirable for various reasons to use packaged device adapters for mounting the packages and reuse such packages after testing. For example, such device packages may be relatively expensive. Further, for example, once attached, the solder material and/or the contact lead elements (e.g., land pads) are not accessible for testing. In addition, it is often difficult to rework the circuit board with the packages soldered thereon.

Various adapters are available for use in electrically connecting a package to a target board for one or more purposes. For example, U.S. Pat. No. 6,533,589 to Palaniappa et al., entitled "Packaged Device Adapter Assembly," issued 18 Mar. 2003; U.S. Pat. No. 6,394,820 to Palaniappa et al., entitled "Packaged Device Adapter Assembly And Mounting Apparatus," issued 28 May 2002; U.S. Pat. No. 5,791,914 to Loranger et al., entitled "Electrical Socket With Floating Guide Plate," issued 11 Aug. 1998; U.S. Pat. No. 4,460,223 to Brown et al., entitled "Cover For Chip Carrier Socket," issued 17 Jul. 1984; U.S. Pat. No. 5,892,245 to Hilton, entitled "Ball grid Array Package Emulator," issued 6 Apr. 1999; and U.S. Pat. No. 5,730,620 to Chan et al., entitled "Method And Apparatus For Locating Electrical Circuit Members," issued 24 Mar. 1998, all describe various adaptors that are used for mounting or locating packaged devices. Many of such adaptors use mechanisms for applying force or pressure on the packaged devices such that electrical contact of the packaged device conductive pads (e.g., pads on the bottom surface of the device) to corresponding contacts (e.g., a conductive elastomer or other arrangement of conductive elements, or further target board conductive land pads) is achieved. However, the mechanisms for applying such a force, at least in many circumstances, may apply too little force leading to inadequate contact or too large a force resulting in potential damage to, for example, contacts, components of the adaptor, etc. For example, as shown in U.S. Pat. No. 6,533,589 to Palaniappa et al., a screw or actuator element is used to apply a force to a floating member which is in direct contact with the packaged device to achieve adequate contact between contact pads of the packaged device and a conductive elastomer layer. In one or more cases, the actuator element or screw may be over tightened.

SUMMARY OF THE INVENTION

The present invention provides a torque limiting assembly that, for example, may be employed with a packaged device adapter for use in mounting or locating high density integrated circuit packages (e.g., micro lead frame packages, micro lead chip carriers, quad flat no lead packages, and micro ball grid array packages, etc.).

One exemplary embodiment of an adapter apparatus according to the present invention is for use with a packaged device having a plurality of contact elements disposed on a surface thereof. The adapter apparatus includes an adapter body defining a socket cavity configured to receive a packaged device such that the plurality of contact elements of the packaged device are at least aligned with arranged conductive elements corresponding thereto. The adapter body (e.g., a clam shell socket base and lid) includes a threaded opening (e.g., a threaded opening in the clam shell lid). The adaptor apparatus further includes a torque limiting assembly for use in applying a force upon a packaged device received in the socket cavity of the adapter body.

The torque limiting assembly includes a shaft, a threaded interface member including a threaded portion configured to mate with the threaded opening of the adapter body, and one or more engagement elements. A torque control apparatus is coupled to the threaded interface member. The torque control apparatus includes a compressible element operatively connected to the one or more engagement elements in a first state to selectively engage the threaded interface member and the shaft, and further the compressible element is operatively connected to the one or more engagement elements in a second state to allow movement between the threaded interface member and the shaft.

In one embodiment of the adapter apparatus, the adapter body includes a socket base defining the socket cavity therein configured to receive a packaged device and a socket lid to close the socket cavity hinged to the socket base. The socket lid includes the threaded opening for mating with the threaded portion of the threaded interface member.

In another embodiment of the adapter apparatus, a compression plate may be coupled to the socket lid such that a force applied by the torque limiting assembly upon a packaged device received in the socket cavity is applied via the compression plate positioned between the threaded portion of the threaded interface member and a packaged device received in the socket cavity.

In another embodiment of the adapter apparatus, the shaft of the torque limiting assembly includes an elongate portion extending along an axis of the torque limiting assembly between a first end region and a second end region. A flange portion extends radially from the axis of the torque limiting assembly at the first end region of the shaft. The flange portion includes one or more openings defined therein for receiving at least a portion of the one or more engagement elements (e.g., one or more rounded elements).

Yet further, in another embodiment of the adapter apparatus, the threaded interface member includes a cylindrical body portion extending along the axis of the torque limiting assembly from a first end region to a second end region. The first end region interfaces directly or indirectly with a packaged device received in the socket cavity and the second end region includes one or more openings defined therein for receiving at least a portion of the one or more engagement elements when operatively connected to the compressible element in the first state. At least a portion of the one or more engagement elements are moved from the one or more openings of the threaded interface member when operatively connected to the compressible element in the second state via the one or more openings defined in the flange of the shaft.

Still, in yet another embodiment of the adapter apparatus, the shaft includes an elongate portion extending along an axis of the torque limiting assembly between a first end region and a second end region, and also includes a flange portion extending radially from the axis of the torque limiting assembly at the first end region of the shaft. The threaded interface member includes a cylindrical body portion extending along the axis of the torque limiting assembly from a first end region to a second end region. The first end region of the threaded interface member interfaces directly or indirectly with a packaged device received in the socket cavity and the second end region of the threaded interface member interfaces with the shaft. A torque control apparatus coupled to the threaded interface member includes a cover structure having a first end affixed to the second end region of the threaded interface member and a second end terminated by a bearing apparatus concentric with and adjacent to the shaft. The cover structure defines a radial cavity about the shaft and the compressible element is loaded into the radial cavity such that it is operatively connected with the one or more engagement elements in at least the first state to selectively engage the threaded interface member and the shaft and operatively connected to the one or more engagement elements in a second state to allow movement between the threaded interface member and the shaft.

In one or more various embodiments of the adapter apparatus, the bearing apparatus may include a one way clutch bearing that allows rotation between the shaft and bearing apparatus in only one direction; the cover structure may include an adjustment mechanism for loading the compressible element at a plurality of compression levels, and the compressible element may include a disc spring.

A method of loading a packaged device in an adapter apparatus according to the present invention is also described. The method includes providing an adapter body defining a socket cavity therein configured to receive a packaged device (i.e., the adapter body includes a threaded opening). A torque limiting assembly for use in applying a force upon a packaged device received in the socket cavity of the adapter body is also provided. The torque limiting assembly includes a threaded interface member including a threaded portion configured to mate with the threaded opening of the adapter body and, also includes a shaft. The method further includes positioning a packaged device in the socket cavity such that the plurality of contact elements of the packaged device are at least aligned with arranged conductive elements corresponding thereto. The threaded portion of the threaded interface member is inserted into the threaded opening of the adapter body and the shaft of the torque limiting assembly is turned for use in applying a force on the packaged device positioned in the socket cavity such that the plurality of contact elements of the packaged device are in electrical contact with the arranged conductive elements corresponding thereto. The threaded interface member is turned into the threaded opening of the adapter body as the shaft is turned and the shaft is disengaged from the threaded interface member upon reaching a predetermined force applied to the packaged device such that the threaded interface member is no longer turned into the threaded opening as the shaft is turned.

Another adapter apparatus according to the present invention for use with a packaged device having a plurality of contact elements disposed on a surface thereof is also described. The adapter apparatus includes an adapter body defining a socket cavity configured to receive a packaged device such that the plurality of contact elements of the packaged device are at least aligned with arranged conductive elements corresponding thereto. The adapter body includes a threaded opening. The apparatus further includes a torque limiting assembly for use in applying a force upon a packaged device received in the socket cavity of the adapter body.

The torque limiting assembly includes a threaded interface member having a threaded portion configured to mate with the threaded opening of the adapter body. The torque limiting assembly (e.g., actuator) further includes a shaft for use in applying a force on a packaged device positioned in the socket cavity such that the plurality of contact elements of the packaged device are in electrical contact with the arranged conductive elements corresponding thereto. The shaft is coupled to the threaded interface member such that the threaded portion of the threaded interface member is turned into the threaded opening of the adapter body as the shaft is turned. Further, the shaft is coupled to the threaded interface member such that the shaft is disengaged from the threaded interface member once a predetermined force is applied to a packaged device received in the socket cavity such that the threaded portion of the threaded interface member is no longer turned into the threaded opening of the adapter body as the shaft is turned.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

DETAILED DESCRIPTION OF THE EMBODIMENTS

Generally, a packaged device adaptor apparatus for use with packaged devices (e.g., high density devices) which employ a torque limiting assembly shall be described herein. An illustrative packaged device adaptor apparatus 10 using a torque limiting assembly according to the present invention shall be described with reference to FIGS. 1–4. Various illustrative embodiments of the torque limiting assembly shall further be described in more detail with reference to FIGS. 5–8.

One skilled in the art will recognize, from the description herein, that the various illustrative embodiments described include some features or elements included in other illustrative embodiments and/or exclude other features. However, packaged device adaptor apparatus according to the present invention may include any combination of elements selected from one or more of the various embodiments as described herein with reference to FIGS. 1–8. For example, as will be readily apparent from the description below, one or more different types of socket bodies, including, for example, a clamshell socket, may utilize the torque limiting assembly described herein. Further, for example, as described herein, an adjustment mechanism for setting a desired torque level for disengaging the torque limiting assembly to prevent further force from being applied thereby may be optional or be provided in various manners. One skilled in the art will readily recognize that an adaptor apparatus employed for one or more various purposes (e.g., locating a packaged device on a target board, mounting a packaged device for testing purposes relative to a target board, etc.) may benefit from the features described herein.

Figure 1:
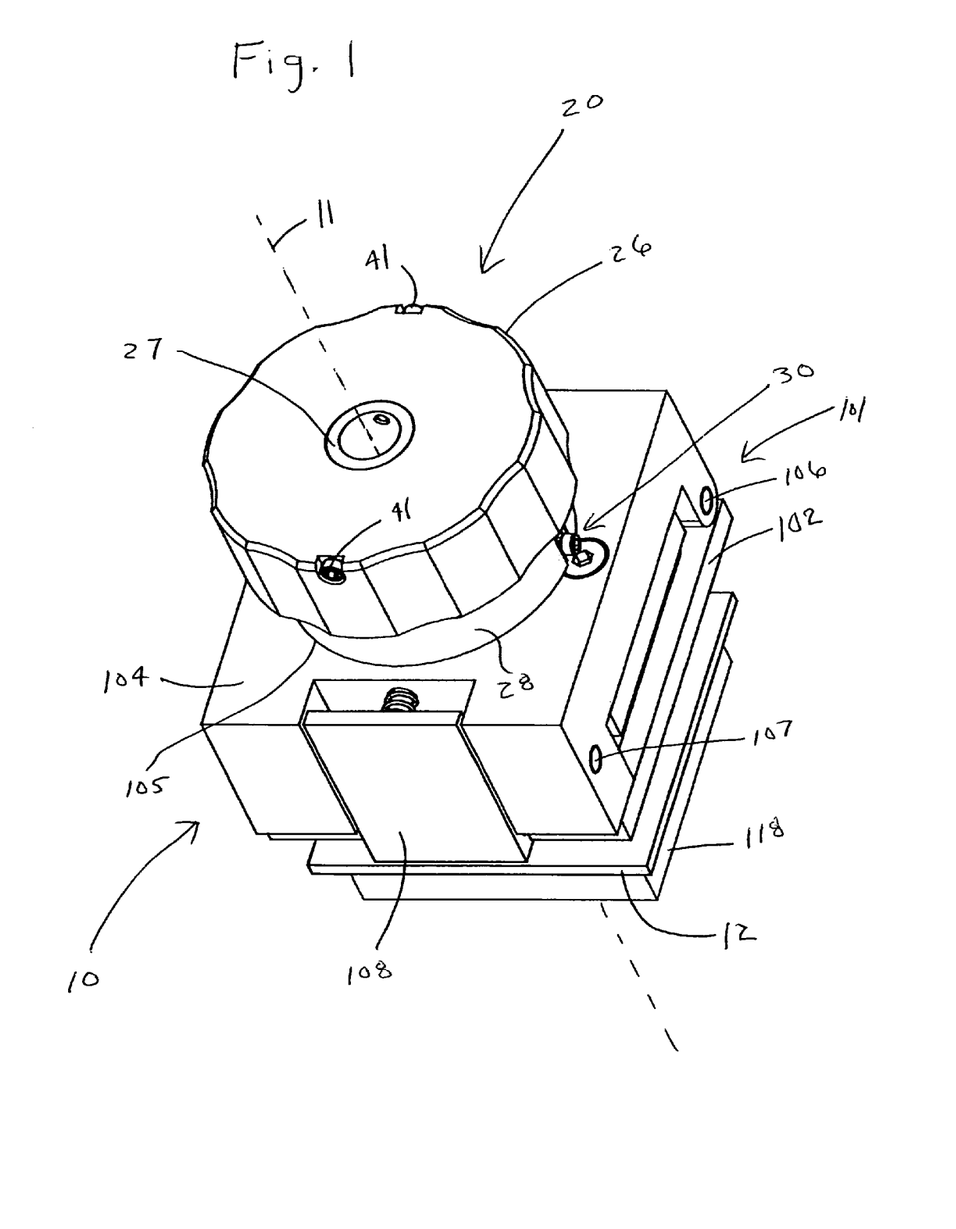
FIG. 1 is a perspective view of an exemplary packaged device adapter apparatus including a torque limiting assembly according to the present invention mounted relative to a target board.
Figure 2:
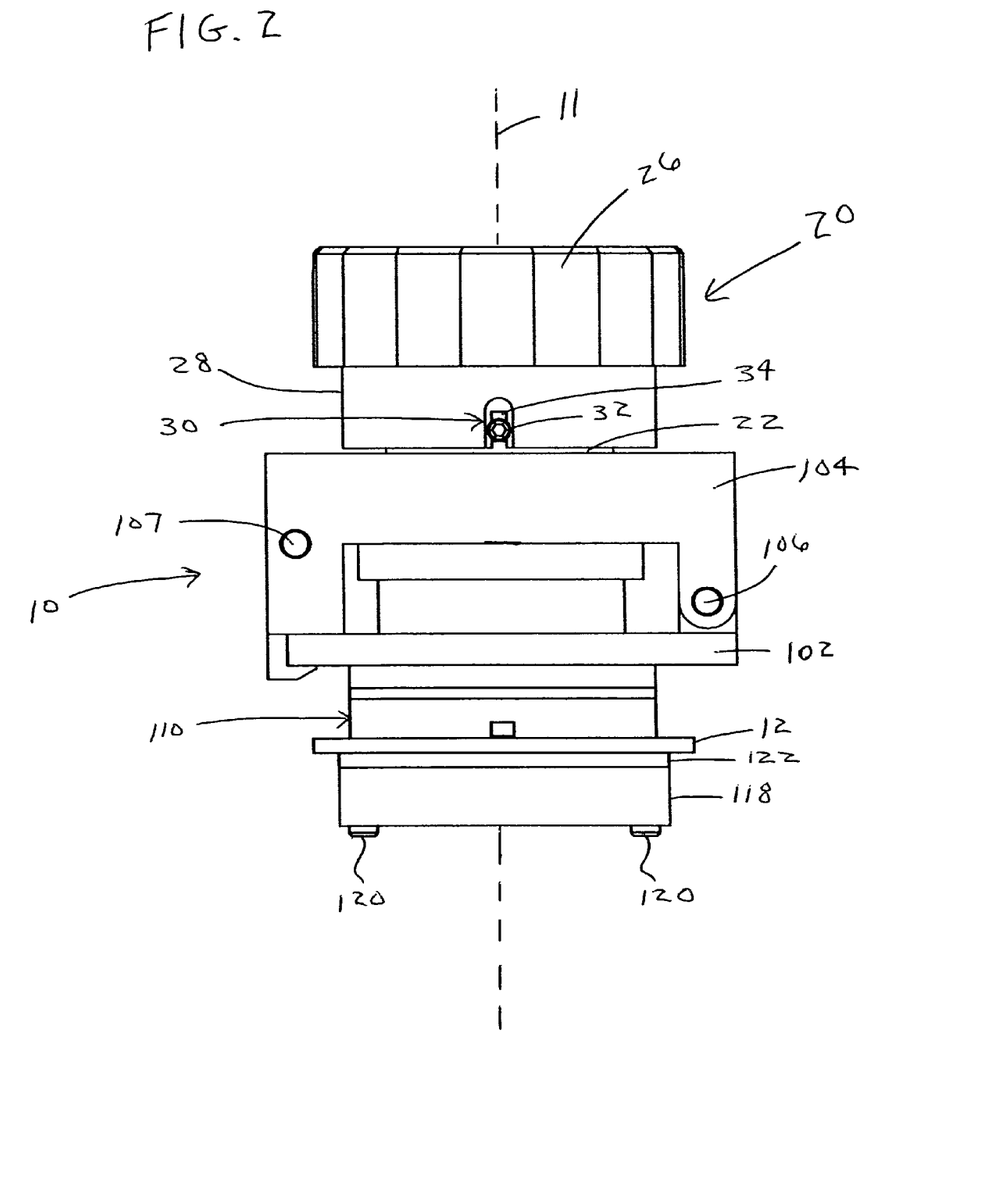
FIG. 2 is a side view of the exemplary packaged device adapter apparatus of FIG. 1.
Figure 3:
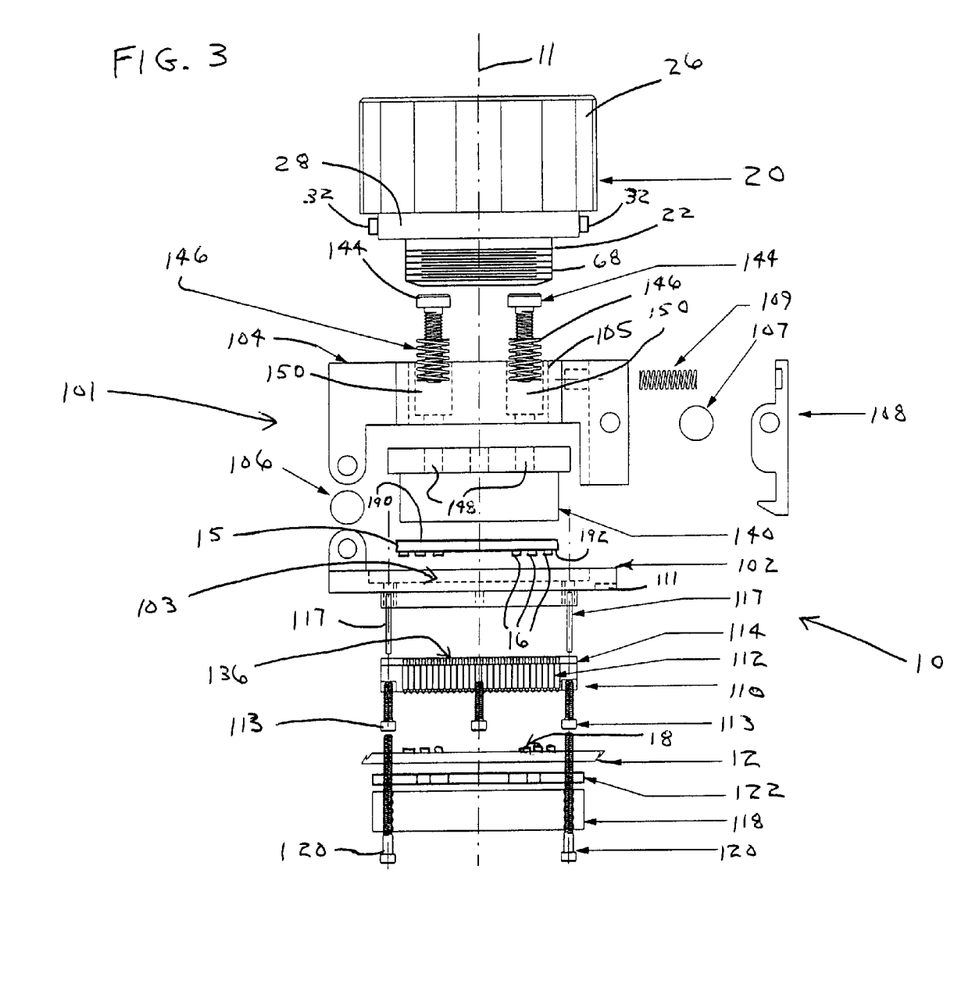
FIG. 3 is a side exploded view of the exemplary packaged device adapter apparatus of FIGS. 1–2.
Figure 4:
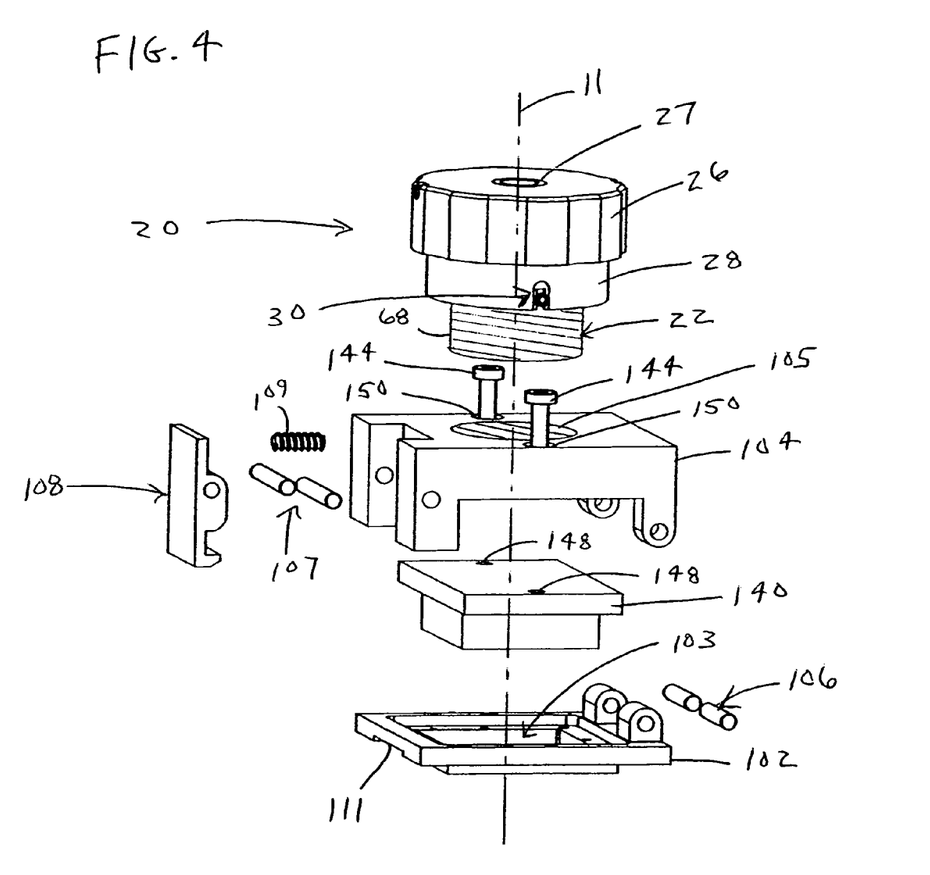
FIG. 4 is an exploded perspective view of a portion of the exemplary packaged device adapter apparatus shown in FIGS. 1–3.

FIG. 1 is a perspective view of an exemplary packaged device adaptor apparatus 10 including a torque limiting assembly 20 according to the present invention. The exemplary packaged device adaptor apparatus 10 is mounted relative to a target board 12. Side and side exploded views of the exemplary packaged device adaptor apparatus 10 are shown in FIGS. 2–3, respectively. Further, FIG. 4 shows an exploded perspective view of a portion of the exemplary packaged device adaptor apparatus of FIGS. 1–3.

The adaptor apparatus 10 is for use with a packaged device 15 (see FIG. 3) having a plurality of contact elements 16 disposed on a surface 192 (e.g., bottom surface) thereof. The adaptor apparatus 10 includes an adaptor body 101 defining a socket cavity 103 (see FIG. 3) configured to receive the packaged device 15 such that the plurality of contact elements 16 of the packaged device 15 are at least aligned with arranged conductive elements. For example, the conductive elements may include conductive elements 136 as shown in FIG. 3 which form a portion of adaptor apparatus 10. However, the conductive elements may include other elements in one or more other applications as will be apparent from the description herein, such as, for example, an arranged pattern of contacts 18 on a surface target board 12 (see FIG. 3). The adaptor body 101 further includes a threaded opening 105.

The torque limiting assembly 20 is provided for use in applying a force upon the packaged device 15 received in the socket cavity 103 defined by the adaptor body 101. Generally, the torque limiting assembly 20 includes a shaft 27 and a threaded interface member 22; the threaded interface member 22 including a threaded portion 68 configured to mate with the threaded opening 105 of the adaptor body 101. Further, the torque limiting assembly 20 includes one or more engagement elements 29 hidden in FIGS. 1–4 but further described with reference to FIGS. 5–8.

A torque control apparatus 25, also substantially hidden in FIGS. 1–4, coupled to the threaded interface member 22 is also provided as part of the torque limiting assembly 20. The torque control apparatus 25 (which shall be described in further detail with respect to FIGS. 5–8) includes a compressible element 94 (e.g., a disc spring) operatively coupled to the one or more engagement elements 29 in a first state to selectively engage the threaded interface member 22 and the shaft 27. In this first state, turning of the torque limiting assembly 20 into the threaded opening 105 asserts a force (e.g., either directly or indirectly) onto packaged device 15 such as, for example, to provide the contact elements 16 of the packaged device 15 into electrical contact with an arrangement of conductive elements (e.g., conductive pin elements 136) corresponding thereto. Yet further, the compressible element 94 is operatively coupled to the one or more engagement elements 29 in a second state which allows movement between the threaded interface member 22 and the shaft 27. For example, in the second state, the threaded interface member 22 and the shaft 27 are disengaged such that relative movement therebetween is allowed to occur (e.g., slipping between such elements) so that the threaded interface member 22 is not turned any further into the threaded opening 105 even though shaft 27 is turned. This prevents (i.e., in the second state) any further force from being applied to the packaged device 15 (e.g., either direct or indirectly) via the threaded interface member 22.

The components of the adaptor apparatus 10, including the torque limiting assembly 20, lie along axis 11. Preferably, the torque limiting assembly 20 is a cylindrical-like assembly that extends along the axis 11 that turns in the threaded opening 105. The axis 11 is generally orthogonal, at least in one embodiment, to the target board 12.

The torque limiting assembly 20 according to the present invention provides an adaptor apparatus 10 (e.g., one or more different configurations of such an adaptor apparatus that includes a threaded opening for mating with such a torque limiting assembly) the ability to limit the amount of force applied to a packaged device 15 when mounted within the adaptor body 101. As such, the packaged device 15 will not be over-compressed. Various problems resulting from overcompression can thus be prevented. For example, such overcompression may reduce the life of various contacts of the packaged device 15 or various conductive elements of the adaptor apparatus 10. As such, with use of the torque limiting assembly, these contacts and conductive elements will last longer. Further, for example, over-compression may damage the target board 12 as well.

The packaged device 15 may be any packaged device having a plurality of contact elements 16 disposed on a surface thereof. In one exemplary embodiment, the packaged device is a device having a high density of contact terminals (e.g., lands, solder spheres, bumps, contact pads, leads, etc.) disposed on the surface thereof. For example, the high density packaged device may be a micro lead frame package, a micro lead chip carrier, a quad flat no-lead package, micro ball grid array package, or any other type of package such as a ball grid array package, a chip scale package, a flip chip package, a flat package, a quad flat package, a small outline package, a land grid array package, or any other package having contact elements disposed on a surface thereof. Although one packaged device 15 is shown in the figures, the present invention is in no manner limited to the use of the illustrative adaptor apparatus embodiments described herein with packages that are configured in such a manner. Rather, adaptor apparatus which employ torque limiting assemblies according to the present invention and as described herein may be used with any packaged device having contact elements disposed on a surface thereof.

In one embodiment, as shown in FIG. 3, packaged device 15 includes an upper surface 190 and a lower surface 192, in addition to one or more side surfaces extending therebetween at the perimeter of the packaged device 15. The plurality of contact elements 16 are disposed at least at the lower surface 192. For example, the contact elements 16 may be distributed in an array along orthogonal X and Y axes, or the contact elements (e.g., lands) may be distributed along the outer portions of the lower surface 192 proximate the perimeter thereof. However, any arrangement of contact elements 16 may be accommodated according to the present invention.

The adaptor body 101 may be provided as any number of components that define the socket cavity 103 configured to receive the packaged device 15 therein. Preferably, the packaged device is received within the socket cavity 103 such that the plurality of contact elements 16 of the packaged device 15 are at least aligned with arranged conductive elements corresponding thereto (e.g., pads of a target board, conductive elastomer elements, etc.). Further, the adaptor body 101 must include the threaded opening 105. Apart from being operable to receive the packaged device 15 and including a threaded opening 105, the configuration of the adaptor body 101 may take any number of forms. For example, the adaptor body may include elements such as those found in U.S. Pat. No. 6,533,589, U.S. Pat. No. 6,394,820, U.S. Pat. No. 5,791,914, U.S. Pat. No. 4,460,223, U.S. Pat. No. 5,892,245, and/or U.S. Pat. No. 5,730,620. For example, such adaptor bodies may be configured for receiving a packaged device 15 to be located or aligned with contact pads on a target board, may be configured for receiving a packaged device such that the contact elements 16 thereof are positioned adjacent a conductive elastomer, or may include, for example, a clamshell socket body as shown and described generally herein with reference to FIGS. 1–4.

Although the torque limiting apparatus 20 is described herein particularly with reference to use with a clamshell socket defining a socket cavity 103, as shown in FIGS. 1–4 and as is apparent from the description herein, the torque limiting assembly 20 may be used with any other adaptor apparatus. Further, for example, the torque limiting assembly 20 may be used in one or more other applications where a threaded opening 105 is provided. Such applications need not be applicable to the area of mounting or, for example, locating packaged devices.

As shown in FIGS. 1–4, the adaptor body 101 (e.g., a clamshell socket) includes a socket base 102 defining the socket cavity 103 therein configured to receive a packaged device 15. The adaptor body 101 further includes a socket lid 104 used to close the socket cavity 103 that is hinged to the socket base 101 using a hinge pin or pins 106. The socket lid 104 includes the threaded opening 105 for mating with the threaded portion of the threaded interface member 22.

Further, as shown in FIGS. 1–4, the adaptor body may include a latch mechanism for latching the lid 104 to the socket base 102. In one embodiment, the latch mechanism includes a latch element 108 connected to the socket lid 104 using a latch spring 109 and a hinge pin and snap ring 107. The latch element 108 engages the socket base 102 at indent 111 achieving a closed and latched state.

The exemplary adaptor body 101 shown in FIGS. 1–4 further includes various components. For example, the adaptor apparatus 10 includes a structure 112 for providing an arrangement of pins 136 (e.g., pogo pins) corresponding to the plurality of contact elements 16 of the packaged device 15 to which they are to be electrically connected. A pin and ball guide top layer 114 is provided to guide the packaged device 15 and align the packaged device 15 to the arranged conductive elements 136 (e.g., pins) along with a guide bottom layer 110 for receiving the conductive elements or pins 136 and holding the pins 136 in a particular configuration. Pin guide screws 113 are provided for holding the arrangement of conductive elements 136 in position, and dowel pins 117 are provided for the socket base 102 to align the pin containing structure 112 relative thereto. Further, an insulation plate 122, a backing plate 118, and socket base screws 120 are provided for mounting the adaptor body 101 relative to the target board 12 (e.g., a printed circuit board).

As previously described herein, the components forming the adaptor body 101 may take one of various different forms, and any particular listing and/or provision of description herein with respect to a particular adaptor body is not to be construed as limiting to the present invention. Further, for example, the arrangement of conductive elements to which the contact elements 16 of the packaged device are aligned and provided in electrical contact with by use of the torque limiting assembly 20, according to the present invention, may take one of various different types of forms. For example, the arrangement of conductive elements may be provided by a conductive elastomer layer, a pin arrangement structure, a socket arrangement structure, or any other arrangement of conductive elements as would be known to one skilled in the art.

Further, in one embodiment of the present invention, a compression plate 140 is provided for transferring the force from the threaded interface member 22 to the packaged device 15. However, such force may be applied directly from the threaded interface member 22 to the packaged device 15. In one or more embodiments, the compression plate 140 may provide for a more distributed force on the packaged device 15, and thus be advantageous.

The compression plate 140 may either be a floating compression plate upon which the threaded interface member 22 makes contact, or the compression plate 140 may be movably coupled to the socket lid 104 or any other component of the adaptor body 101. For example, as shown in FIGS. 1–4, the compression plate 140 includes threaded openings 148 for mating with clamshell screws 144 inserted within openings 150 of clamshell lid 104 to mount the compression plate 140 relative to the socket lid 104. Clamshell screw springs 146 allow for the effective transmission of force from the threaded interface member 22 to the compression plate 140 when the compression plate 140 is mounted to the socket lid 104.

Figure 5:
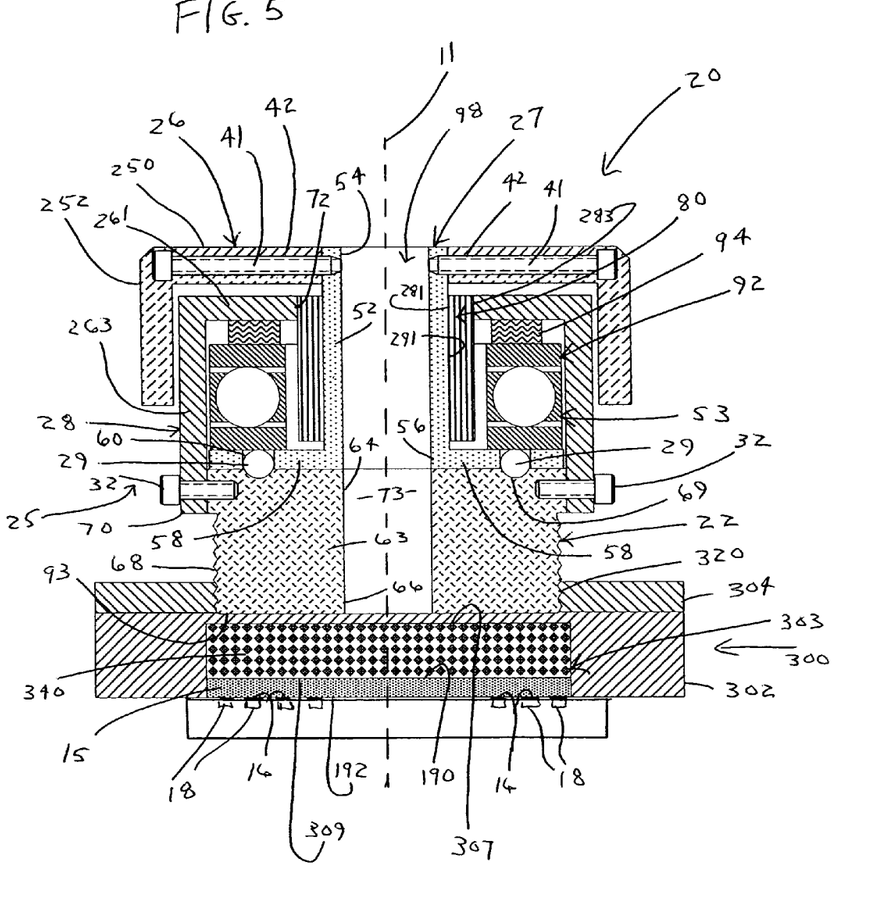
FIG. 5 is diagrammatic cross-section view of a portion of the exemplary packaged device adapter apparatus of FIGS. 1–4, and primarily the torque limiting assembly according to the present invention that may be used with the packaged device adapter apparatus such as that shown in FIGS. 1–4 but also with any number of different adapters having a threaded opening configured for operation with the torque limiting assembly; the torque limiting assembly of FIG. 5 being shown in a first state wherein a shaft of the torque limiting assembly is engaged with a threaded interface member of the torque limiting assembly.

FIG. 5 is a diagrammatic cross-section view of a portion of an exemplary packaged device adaptor apparatus 300 primarily showing further detail of a torque limiting assembly 20 of FIGS. 1–4. In other words, the torque limiting assembly 20 may be used with the packaged device adaptor apparatus 300, as well as the components of the adaptor apparatus 10 shown in FIGS. 1–4.

Figure 6:
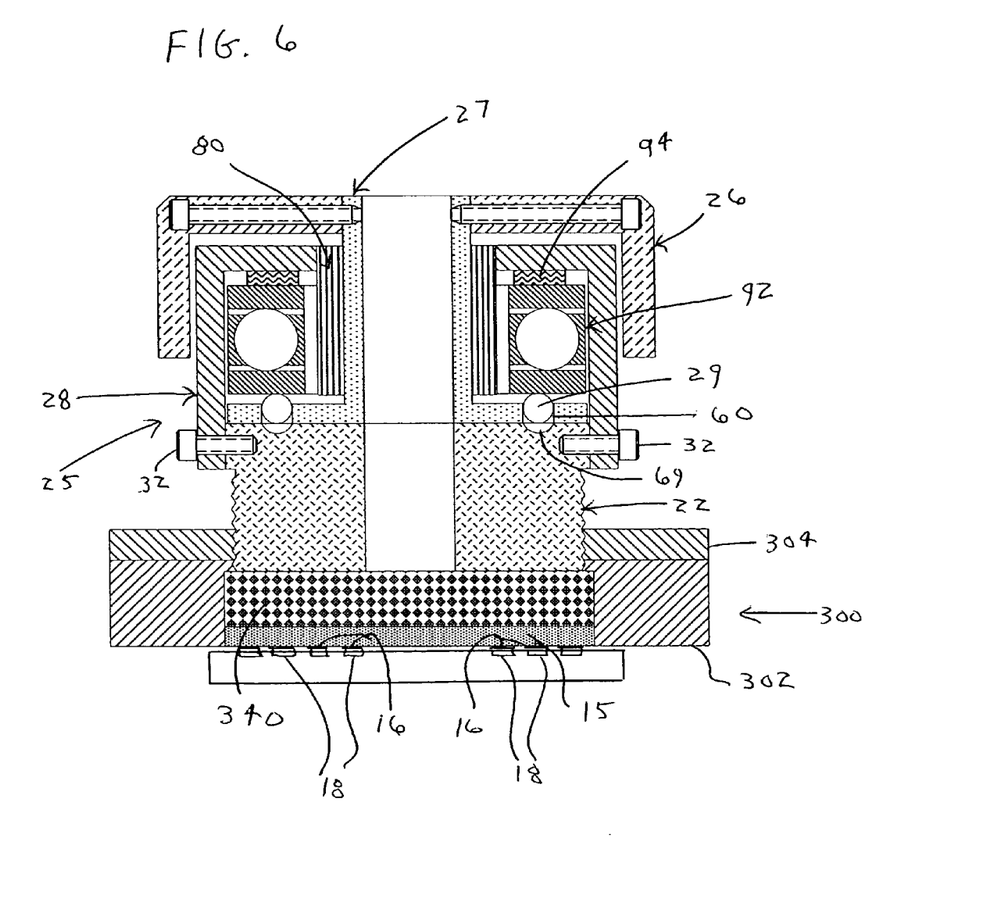
FIG. 6 is the diagrammatic cross-section view of FIG. 5 shown with the torque limiting assembly being shown in a second state wherein the shaft of the torque limiting assembly is disengaged with the threaded interface member of the torque limiting assembly.

The torque limiting assembly 20 in FIG. 5 is shown in a first state wherein the shaft 27 of the torque limiting assembly 20 is engaged with a threaded interface member 22 of the torque limiting assembly 20. FIG. 6, on the other hand, is the same diagrammatic cross-section view of FIG. 5 shown with the torque limiting assembly 20 being in a second state wherein the shaft 27 of the torque limiting assembly 20 is disengaged with the threaded interface member 22 of the torque limiting assembly 20. Further details of the exemplary torque limiting assembly 20 are shown in the exploded perspective view of FIG. 7 and the exploded side view of the torque limiting assembly 20 shown in FIG. 8.

As shown in FIG. 5, the adaptor body 300, which is employed with the torque limiting assembly 20, includes a socket base 302 and a socket lid 304. The socket lid 304 includes a threaded opening 320 adapted to receive a threaded portion 68 of the threaded interface member 22.

Further, as shown in FIG. 5, a floating compression plate 340 including an upper surface 307 and a lower surface 309 is provided between the threaded interface member 22 and packaged device 15. The packaged device 15 is positioned within a socket cavity 303 of the socket base 302 of the adaptor body 300. The packaged device 15 includes a plurality of contact elements 16 (e.g., land pads, balls, etc.) in a pattern on the lower surface 192 of the packaged device 15. When received in the socket cavity 303 of the adaptor body 300, the contact elements 16 are aligned with one or more conductive elements 18 corresponding to the plurality of contact elements 16 disposed on the lower surface 192 of the packaged device 15. For example, the conductive elements 16 may be part of the adaptor apparatus, such as shown in FIG. 3, may be contact pads on a target board, may be part of a conductive elastomer layer, etc. The present invention is not limited to any particular conductive elements to which the packaged device is to be electrically connected.

In operation, with the packaged device 15 received within the socket cavity 303 and the lid 304 being coupled to the socket base 302 (e.g., latched), the torque limiting assembly 20 applies a limited torque to the packaged device 15. As only a limited torque is applied to the packaged device 15, the packaged device 15 cannot be overcompressed at the interface of the contact elements 16 and conductive elements 18, which provides a longer lasting life for the components.

For example, in operation, the threaded interface member 22 of the torque limiting apparatus 20 is inserted into threaded opening 320 of the socket lid 304. Using handle element 26 which is fixed to shaft 27, the threaded interface member 22, which is engaged with the shaft 27 using one or more engagement elements 29, is turned into threaded opening 320 of socket lid 304. As the threaded interface member 22 is turned into the opening 320, the lower surface 93 of the threaded interface member 22 contacts the upper surface 307 of the floating compression plate 340 such that the lower surface 309 of the compression plate 340 comes in direct contact with the upper surface 190 of the packaged device 15. As the adaptor body 300 is mounted relative to the structure including conductive elements 18, effective electrical contact between the aligned contact elements 16 and the arranged conductive elements 18 is achieved.

As the shaft 27 continues to be turned by handle element 26 of torque limiting assembly 20, additional force is applied onto packaged device 15. Upon reaching a predetermined force applied to the packaged device 15, the threaded interface member 22 becomes disengaged from the shaft 27, as shown in one exemplary embodiment, by the movement of the one or more engagement elements 29 in FIG. 6. Upon such disengagement between the shaft 27 and the threaded interface member 22, the threaded interface member 22 is no longer turned into the threaded opening 320 as the shaft 27 is turned (e.g., the shaft 27 slips relative to the threaded interface member 22). As such, no additional force is applied to the packaged device 15 or, in other words, the torque applied thereto is limited. Further detail with respect to the engagement and disengagement of the shaft 27 from the threaded interface member 22 shall be described after providing further detail with respect to the components of the exemplary torque limiting assembly 20.

As shown in FIGS. 5–8, the torque limiting assembly 20 includes the shaft 27, which may be engaged or disengaged to the threaded interface member 22 using one or more engagement elements 29, as well as a torque control apparatus 25 coupled to the threaded interface member 22. The torque limiting assembly 20 further includes the handle element 26 coupled to the shaft 27.

The shaft 27 includes an elongate portion 52 extending along axis 11 of the torque limiting assembly 20 (e.g., the same axis as the axis of the adaptor). The elongate element 52 extends between a first end region 56 and a second end region 54. The shaft 27 further includes a flange portion 58 extending radially from the axis 11 of the torque limiting assembly 20 at the first end region 56 of the shaft 27. The flange portion 58 of the shaft 27 includes one or more openings 60 defined therein for receiving at least a portion of the one or more engagement elements 29.

In one embodiment, the flange 58 includes circular openings (see FIG. 7) sized as a function of the engagement elements 29. The circular openings 60 are spaced apart and positioned at a radial distance from the axis 11 (e.g., form a circular ring of openings 60 at a distance from axis 11). One will recognize that the configuration of openings 60 may vary depending upon the type of engagement elements utilized in conjunction with the torque limiting apparatus 20.

The second end region 54 of the shaft 27 is provided with one or more openings 55 used for connection of handle element 26 thereto. The handle element 26 may include any configuration suitable for use in turning shaft 27 (e.g., an ergonomic handle). In the exemplary embodiments shown in FIGS. 5–8, the handle element 26 includes a first portion 250 extending radially from axis 11 connected to a cylindrical portion 252 which is sized and configured to cover other components of the torque limiting assembly 20. For example, the handle 26 may cover portions of the torque control apparatus 25.

The handle 26 is coupled to the shaft 27 such that turning of the handle 26 turns shaft 27. Although any suitable connection mechanisms may be used, one exemplary configuration shows the use of handle screws 41 inserted through openings 42 in the first radial portion 250 of the handle 26 and received and affixed in threaded openings 55 at the second region 54 of the shaft 27.

The threaded interface portion 22 includes a cylindrical body portion 63 extending along the axis 11 of the torque limiting assembly 20 from a first end region 66 to a second end region 64. At least a portion of the outer surface of a cylindrical body portion 63 includes a threaded portion 68 configured to mate with the threaded opening 320 of the adaptor body 300. The first end region 66 includes the lower end surface 93 for use in interfacing directly or indirectly with a packaged device 15 received in the socket cavity 303. For example, the lower end surface 93 may interface directly with the upper surface 190 of the packaged device 15 or may interface indirectly with the packaged device 15 through use of compression plate 340.

The second end region 64 of the cylindrical body portion 63 includes one or more openings 69 configured for receiving at least a portion of the one or more engagement elements 29 when the torque limiting apparatus is operating in a first state wherein the shaft 27 is engaged with the threaded interface member 22. As shown in FIGS. 5–8, the openings 69 include partial spherical openings (e.g., concave depressions) at a position radially from axis 11 corresponding to the openings 60 defined in the flange 58 of shaft 27. In other words, the openings 69 and the openings 60 are located at the same radial distance from axis 11. One will recognize that the size and shape of such openings 69, like openings 60, will depend upon the type of engagement elements 29 used in the torque limiting assembly 20.

As shown in FIGS. 5–8, the one or more engagement elements 29 are rounded elements. As used herein, rounded elements are any elements that have one or more curved surfaces associated therewith. Preferably, according to the present invention, a spherical element is used. However, one skilled in the art will recognize that engagement and disengagement mechanisms other than those that use a spherical or ball engagement element may be employed according to the present invention. For example, engagement pins and openings configured therewith, cylindrical shapes, and other curved shapes that allow radial movement may be used to provide for engagement and disengagement between the shaft 27 and threaded interface member 22.

The shaft 27 includes an opening 98 extending along axis 11, and threaded interface member 22 also includes an opening 73 extending therethrough along axis 11. With the shaft 27 and the threaded interface member 22 coupled together according to the present invention, a single opening extends all the way through the torque limiting assembly 20 such that a packaged device 15 residing in socket cavity 303 may be accessed (e.g., test probe, ventilation, etc.).

The torque control apparatus 25 coupled to the threaded interface member 22 includes a cover structure 28 extending from a first end region 70 to a second end region 72. The first end region 70 is affixed to the second end region 64 of the threaded interface member 22. One will recognize that any mechanism for connecting the first end region 70 of the cover structure 28 to the second end region 64 of the threaded interface member 22 may be used. As shown in FIGS. 5–8, in one exemplary embodiment, cover screws 32 are inserted through openings 34 in cover structure 28 and received in threaded openings 67 located at the second end region 64 of the threaded interface member 22.

Figure 7:
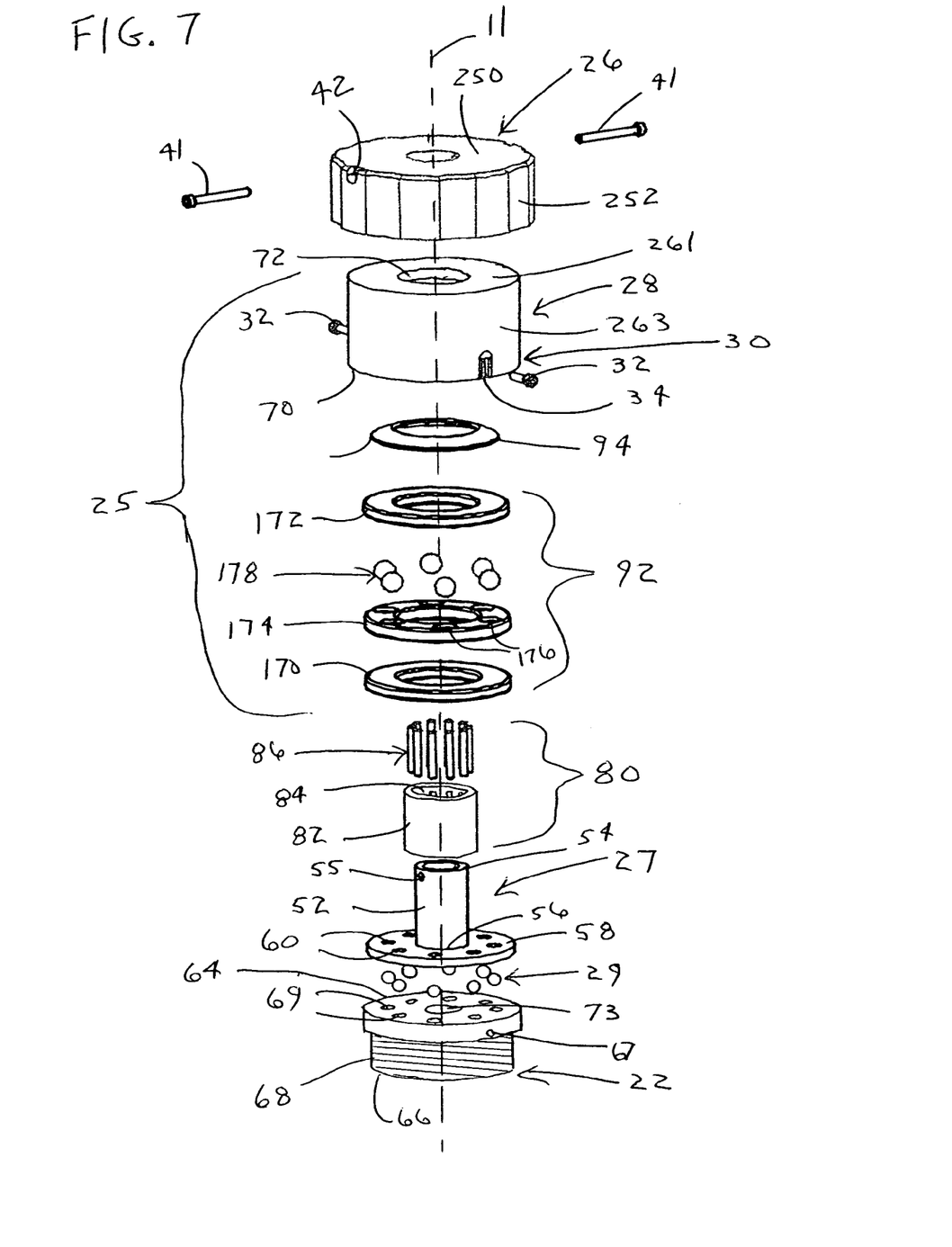
FIG. 7 is an exploded perspective view of the torque limiting assembly shown in FIGS. 1–6.

In one embodiment, the opening 34, as shown in FIG. 7 (and also FIG. 2), includes a slot such that the location of the cover structure 28 relative to the threaded interface member 22 can be adjusted by vertical movement of the cover structure 28 (e.g., up and down along axis 11) and tightening of the cover screws 32 when the cover structure 28 is in a particular desired position.

The cover structure 28 shown in FIGS. 5–8 includes a first radial extending portion 261 with a cylindrical portion 263 extending therefrom at a particular distance from axis 11. The cylindrical portion 263 (at the distal end thereof corresponding to first end region 70 of the cover structure 28) is attached to the threaded interface member 22. The radial portion 261 having an end corresponding to second end 72 of the cover structure 28 terminates with a bearing apparatus 80.

The bearing apparatus 80 is a cylindrical bearing apparatus having an inner portion 281 sized for contact with outer surface 291 of shaft 27. The outer surface 283 of the cylindrical bearing apparatus 80 is press-fit to the second end 72 of the cover structure 28.

Figure 8:
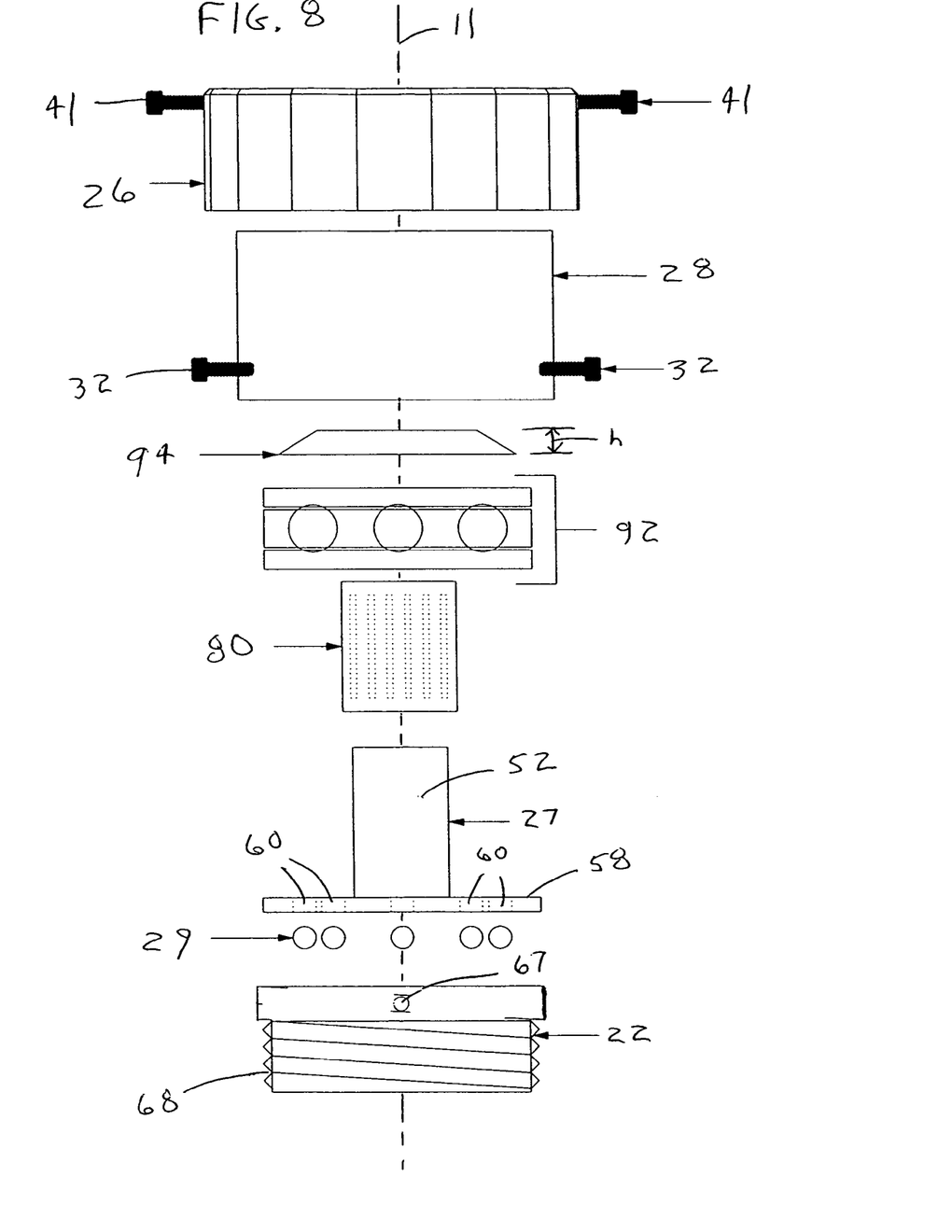
FIG. 8 is an exploded side view of the torque limiting assembly shown in FIGS. 1–7.

As shown in FIGS. 7–8, the bearing apparatus 80 is a one-way clutch bearing allowing radial rotation of shaft 27 within the bearing apparatus 80 in one direction only. As shown in FIG. 7, the bearing apparatus 80 includes a cylindrical housing 82 including a plurality of bushing elements 86 mounted at an inner surface 84 of the cylindrical body 82 for contact with the outer surface 291 of shaft 27. Inner surface 84 has individual cavities defined therein; each individual cavity for receiving an individual bushing element 86 (e.g., a cylindrical member or pin). Each individual cavity is shaped such that the bushing element 86 received therein rolls in one direction freely. When attempting to roll in the other direction, the bushing element 86 engages with the wall of the individual cavity and is prevented from rolling. For example, each cavity may be formed with a curved shape from a first edge to a second edge corresponding to the shape of a cylindrical bushing element. The first edge may include a lip that engages the cylindrical bushing element and prevents it from rolling in one direction while the second edge is shaped to allow the cylindrical bushing element to roll in the other direction.

The one-way clutch bearing apparatus 80 allows the shaft 27 to be turned in a first direction such that the threaded interface member 22, when engaged with the shaft 27, can be turned into threaded opening 320 in the socket body 300. Relative motion between the shaft 27 and the bearing apparatus 80 in a direction opposite the first direction is not permitted; thus the torque limiting assembly 20 may be turned out of the threaded opening 320.

The cover structure 28 defines a radial cavity 53 about the shaft 27 between the cover structure 28 and the shaft 27 (e.g., a volume defined about the shaft 27 lying at a distance from the axis 11). A compressible element 94 is loaded into the radial cavity 53 such that it is operatively connected with the one or more engagement elements 29 in at least the first state to selectively engage the threaded interface member 22 and the shaft 27 and operably connected to the one or more engagement elements 29 in a second state to allow movement between the threaded interface member 22 and the shaft 27.

The compressible element 94 may be any compressible element suitable for loading to a predetermined force within the radial cavity 53. For example, the compressible element 94 may be a disc spring, a compressible wound spring, or any other compressible device. Preferably, according to the present invention, the compressible element 94 is a disc spring. For example, a disc spring includes primarily a convex disc (e.g., washer) supported at the outer periphery by one force and an opposing force on the inner perimeter of the disc.

Within the radial cavity 53, a thrust bearing apparatus 92 is also provided. Thrust bearing apparatus 92, as shown in FIGS. 7–8, include first and second washers 170, 172 in which is sandwiched a third washer 174 that includes a plurality of openings 176 configured for receiving a plurality of balls 178. The thrust bearing 92 allows for a smooth force transmission between components of the torque limiting assembly 20 (e.g., to the shaft from the disc spring 94). One will recognize that a bearing apparatus in the radial cavity is optional and the compressible element 94 may be loaded using any other number of components within the radial cavity 53.

As assembled and shown in FIGS. 5–8, the threaded interface member 22 compresses the disc spring 94 to a certain distance or certain height (h). When the disc spring 94 is in a free state, there is no force associated therewith. However, when the spring 94 is compressed to the certain height (h), it exerts a force (f). This force f may be adjusted by varying the compression of the disc spring 94 within the radial cavity 53 using, for example, the adjustment mechanism 30 provided by the slot 34 and cover screw 32. In other words, adjusting the distance between the radial portion 261 of the cover structure 28 and the second end region 64 of the threaded interface member 22 provides for a different compression force on the compressible element 94. The force loaded on the compression spring, in addition to the threaded interface member screw threads (e.g., angle, pitch, etc.), correspond to a certain torque.

With the torque limiting assembly 20 assembled, when the handle element 26 is turned, the shaft 27 also turns. The shaft 27 is engaged in the first state to the threaded interface member 22 through the engagement elements 29 being positioned at least partially within openings 69 and partially within openings 60 of the flange 58 of the shaft 27.

When the shaft 27 is turned, the threaded interface member 22 can be turned into the threaded opening 320 and, when turned to a particular distance, apply a force to the packaged device 15. When a force corresponding to the force f is exerted on the packaged device 15 (i.e., a torque corresponding thereto), the compressible element 94 is no longer exerting any further force onto the one or more engagement elements 29. The one or more engagement elements 29 (e.g., steel balls) will lift up, as shown in FIG. 6, within the openings 60 of flange 58. As the shaft 27 is turned, the engagement elements 29 will then go to a next slot or opening 69 in the threaded interface member 22 in a circular fashion. This disengages the shaft 27 from the threaded interface member 22. In other words, as the shaft 27 is turned, the engagement elements 29 continue to lift up and go to the next opening in a circular fashion preventing the threaded interface member 22 from turning.

In other words, using an adaptor apparatus that includes the torque limiting assembly 20 according to one embodiment of the present invention, a packaged device 15 is positioned in socket cavity 303 of the adaptor body 300 such that the plurality of contact elements of the packaged device are at least aligned with arranged conductive elements 18 corresponding thereto. The threaded portion 68 of the threaded interface member 22 is inserted into the threaded opening 320 of the adaptor body 300. The shaft 27 of the torque limiting assembly 20 is turned using handle 26 for use in applying a force on the packaged device 15 positioned in the socket cavity 303 such that the plurality of contact elements 16 of the packaged device 15 are in electrical contact with the arranged conductive elements 18 corresponding thereto. The threaded interface member 22 is turned into the threaded opening 320 of the adaptor body 300 as the shaft 27 is turned. The shaft 27 is disengaged from the threaded interface member 22 upon reaching a predetermined force applied to the packaged device 15 such that the threaded interface member 22 is no longer turned into the threaded opening 320 as the shaft 27 is turned.

In other words, in a first state of the torque limiting assembly 20, as the shaft 27 is being turned, the shaft 27 is engaged with the threaded interface member 22 using the one or more engagement elements 29. Further, as the shaft 27 is being turned, upon reaching a desired or predetermined force on the packaged device 15 (e.g., set by the compression of compressible element 94 within the radial cavity 53), the shaft 27 becomes disengaged from the threaded interface member 22 (e.g., the engagement elements are lifted up into the openings of the shaft 27) and the torque limiting assembly 20 operated in a second state.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative adapter assembly embodiments may be provided which utilize various combinations of the elements described herein. Various modifications of the illustrative embodiments, as well as additional embodiments of the invention and combinations of various elements herein, will be apparent to persons skilled in the art upon reference to this description. It is therefore contemplated that the patented claims will cover any such modifications or embodiments that may fall within the scope of the present invention as defined by the accompanying claims.

What is claimed is:

1. An adapter apparatus for use with a packaged device having a plurality of contact elements disposed on a surface thereof, the adapter apparatus comprising:

an adapter body defining a socket cavity configured to receive a packaged device such that the plurality of contact elements of the packaged device are at least aligned with arranged conductive elements corresponding thereto, and further wherein the adapter body comprises a threaded opening; and a torque limiting assembly for use in applying a force upon a packaged device received in the socket cavity of the adapter body, wherein the torque limiting assembly comprises:

a shaft;

a threaded interface member comprising a threaded portion configured to mate with the threaded opening of the adapter body;

one or more engagement elements; and a torque control apparatus coupled to the threaded interface member, the torque control apparatus comprising a compressible element operatively connected to the one or more engagement elements in a first state to selectively engage the threaded interface member and the shaft and operatively connected to the one or more engagement elements in a second state to allow movement between the threaded interface member and the shaft.

2. The adapter apparatus of claim 1, wherein the adapter body defining a socket cavity therein configured to receive a packaged device comprises:
 a socket base defining the socket cavity therein configured to receive a packaged device; and
 a socket lid to close the socket cavity hinged to the socket base, wherein the socket lid comprises the threaded opening for mating with the threaded portion of the threaded interface member.

3. The adapter apparatus of claim 2, wherein the adapter apparatus further comprises a compression plate coupled to the socket lid such that a force applied by the torque limiting assembly upon a packaged device received in the socket cavity is applied via the compression plate positioned between the threaded portion of the threaded interface member and a packaged device received in the socket cavity.

4. The adapter apparatus of claim 1, wherein the shaft of the torque limiting assembly comprises:
 an elongate portion extending along an axis of the torque limiting assembly between a first end region and a second end region; and
 a flange portion extending radially from the axis of the torque limiting assembly at the first end region of the shaft, wherein the flange portion comprises one or more openings defined therein for receiving at least a portion of the one or more engagement elements.

5. The adapter apparatus of claim 4, wherein the threaded interface member comprises a cylindrical body portion extending along the axis of the torque limiting assembly from a first end region to a second end region, the first end region for use in interfacing directly or indirectly with a packaged device received in the socket cavity and the second end region comprising one or more openings defined therein for receiving at least a portion of the one or more engagement elements when operatively connected to the compressible element in the first state, wherein the at least a portion of the one or more engagement elements are moved from the one or more openings of the threaded interface member when operatively connected to the compressible element in the second state via the one or more openings defined in the flange of the shaft.

6. The adapter apparatus of claim 5, wherein the one or more engagement elements comprise one or more rounded elements.

7. The adapter apparatus of claim 1, wherein the shaft comprises an elongate portion extending along an axis of the torque limiting assembly between a first end region to a second end region and a flange portion extending radially from the axis of the torque limiting assembly at the first end region of the shaft, wherein the threaded interface member comprises a cylindrical body portion extending along an axis of the torque limiting assembly from a first end region to a second end region, the first end region of the threaded interface member for use in interfacing directly or indirectly with a packaged device received in the socket cavity and the second end region of the threaded interface member interfacing with the shaft, and further wherein the torque control apparatus coupled to the threaded interface member comprises:
 a cover structure having a first end affixed to the second end region of the threaded interface member and a second end terminated by a bearing apparatus concentric with and adjacent to the shaft, wherein the cover structure defines a radial cavity about the shaft, and further wherein the compressible element is loaded into the radial cavity such that it is operatively connected with the one or more engagement elements in at least the first state to selectively engage the threaded interface member and the shaft and operatively connected to the one or more engagement elements in a second state to allow movement between the threaded interface member and the shaft.

8. The adapter apparatus of claim 7, wherein the bearing apparatus comprises a one way clutch bearing that allows rotation between the shaft and bearing apparatus in only one direction.

9. The adapter apparatus of claim 7, wherein the cover structure comprises an adjustment mechanism for loading the compressible element at a plurality of compression levels.

10. The adapter apparatus of claim 1, wherein the compressible element comprises a disc spring.

11. A method of loading a packaged device in an adapter apparatus, wherein the packaged device comprises a plurality of contact elements disposed on a surface thereof, wherein the method comprises:
 providing an adapter body defining a socket cavity therein configured to receive a packaged device, wherein the adapter body comprises a threaded opening;
 providing a torque limiting assembly for use in applying a force upon a packaged device received in the socket cavity of the adapter body, the torque limiting assembly comprising a threaded interface member comprising a threaded portion configured to mate with the threaded opening of the adapter body, wherein the torque limiting assembly further comprises a shaft;
 positioning a packaged device in the socket cavity such that the plurality of contact elements of the packaged device are at least aligned with arranged conductive elements corresponding thereto;
 inserting the threaded portion of the threaded interface member into the threaded opening of the adapter body;
 turning the shaft of the torque limiting assembly for use in applying a force on the packaged device positioned in the socket cavity such that the plurality of contact elements of the packaged device are in electrical contact with the arranged conductive elements corresponding thereto, wherein the threaded interface member is turned into the threaded opening of the adapter body as the shaft is turned; and
 disengaging the shaft from the threaded interface member upon reaching a predetermined force applied to the packaged device such that the threaded interface member is no longer turned into the threaded opening as the shaft is turned.

12. The method of claim 11, wherein providing the adapter body defining a socket cavity therein configured to receive a packaged device comprises providing a socket base defining the socket cavity therein configured to receive a packaged device and a socket lid hinged to the socket base to close the socket cavity, wherein the socket lid comprises the threaded opening defined for mating with the threaded portion of the threaded interface member, and further wherein positioning a packaged device in the socket cavity comprises:
 opening the socket lid and positioning a packaged device in the socket cavity such that the plurality of contact elements of the packaged device are at least aligned with arranged conductive elements corresponding thereto; and
 closing and latching the socket lid to the socket base.

13. The method of claim 11, wherein the method further comprises adjusting the predetermined force applied to the packaged device necessary to disengage the shaft from the threaded interface member such that the threaded interface member no longer turns into the threaded opening as the shaft is turned.

14. An adapter apparatus for use with a packaged device having a plurality of contact elements disposed on a surface thereof, the adapter apparatus comprising:

an adapter body defining a socket cavity configured to receive a packaged device such that the plurality of contact elements of the packaged device are at least aligned with arranged conductive elements corresponding thereto, wherein the adapter body comprises a threaded opening; and a torque limiting assembly for use in applying a force upon a packaged device received in the socket cavity of the adapter body, wherein the torque limiting assembly comprises:

a threaded interface member comprising a threaded portion configured to mate with the threaded opening of the adapter body;

a shaft for use in applying a force on a packaged device positioned in the socket cavity such that the plurality of contact elements of the packaged device are in electrical contact with the arranged conductive elements corresponding thereto, wherein the shaft is coupled to the threaded interface member such that the threaded portion of the threaded interface member is turned into the threaded opening of the adapter body as the shaft is turned, and further wherein the shaft is coupled to the threaded interface member such that the shaft is disengaged from the threaded interface member once a predetermined force is applied to a packaged device received in the socket cavity such that the threaded portion of the threaded interface member is no longer turned into the threaded opening of the adapter body as the shaft is turned.

15. The adapter apparatus of claim 14, wherein the torque limiting assembly further comprises:

one or more engagement elements; and a torque control apparatus coupled to the threaded interface member, the torque control apparatus comprising a compressible element operatively connected to the one or more engagement elements in a first state to selectively engage the threaded interface member and the shaft and operatively connected to the one or more engagement elements in a second state to allow movement between the threaded interface member and the shaft.

16. The adapter apparatus of claim 15, wherein the shaft of the torque limiting assembly comprises:

an elongate portion extending along an axis of the torque limiting assembly between a first end region to a second end region; and a flange portion extending radially from the axis of the torque limiting assembly at the first end region of the shaft, wherein the flange portion comprises one or more openings defined therein for receiving at least a portion of the one or more engagement elements.

17. The adapter apparatus of claim 15, wherein the threaded interface member comprises a cylindrical body portion extending along the axis of the torque limiting assembly from a first end region to a second end region, the first end region for use in interfacing directly or indirectly with a packaged device received in the socket cavity and the second end region comprising one or more openings defined therein for receiving at least a portion of the one or more engagement elements when operatively connected to the compressible element in the first state, wherein the at least a portion of the one or more engagement elements are moved from the one or more openings of the threaded interface member when operatively connected to the compressible element in the second state via the one or more openings defined in the flange of the shaft.

18. The adapter apparatus of claim 15, wherein the shaft comprises an elongate portion extending along an axis of the torque limiting assembly between a first end region to a second end region and a flange portion extending radially from the axis of the torque limiting assembly at the first end region of the shaft, wherein the threaded interface member comprises a cylindrical body portion extending along an axis of the torque limiting assembly from a first end region to a second end region, the first end region of the threaded interface member for use in interfacing directly or indirectly with a packaged device received in the socket cavity and the second end region of the threaded interface member interfacing with the shaft, and further wherein the torque control apparatus coupled to the threaded interface member comprises:

a cover structure having a first end affixed to the second end region of the threaded interface member and a second end terminated by a bearing apparatus concentric with and adjacent to the shaft, wherein the cover structure defines a radial cavity about the shaft, and further wherein the compressible element is loaded into the radial cavity such that it is operatively connected with the one or more engagement elements in at least the first state to selectively engage the threaded interface member and the shaft and operatively connected to the one or more engagement elements in a second state to allow movement between the threaded interface member and the shaft.

19. The adapter apparatus of claim 14, wherein the adapter body defining a socket cavity therein configured to receive a packaged device comprises:

a socket base defining the socket cavity therein configured to receive a packaged device; and a socket lid to close the socket cavity hinged to the socket base, wherein the socket lid comprises the threaded opening for mating with the threaded portion of the threaded interface member.

20. The adapter apparatus of claim 19, wherein the adapter apparatus further comprises a compression plate coupled to the socket lid such that a force applied by the torque limiting assembly upon a packaged device received in the socket cavity is applied via the compression plate positioned between the threaded portion of the threaded interface member and a packaged device received in the socket cavity.

\* \* \* \* \*